(12) United States Patent
Hadipour (10) Patent No.: US 10,703,642 B2
(45) Date of Patent: Jul. 7, 2020

(54) DOPED TITANATE (71) Applicant: IMEC VZW, Leuven (BE)

(72) Inventor: Afshin Hadipour, Heverlee (BE)

(73) Assignee: IMEC vzw (BE)

( * ) Notice: Subject to any disclaimer, the term of this patent is extended or adjusted under 35 U.S.C. 154(b) by 0 days.

(21) Appl. No.: 16/061,307

(22) PCT Filed: Dec. 19, 2016

(86) PCT No.: PCT/EP2016/081781
§ 371 (c)(1),
(2) Date: Jun. 11, 2018

(87) PCT Pub. No.: WO2017/108710
PCT Pub. Date: Jun. 29, 2017

(65) Prior Publication Data
US 2018/0370811 A1 Dec. 27, 2018

(30) Foreign Application Priority Data
Dec. 21, 2015 (EP) .................................... 15201493

(51) Int. Cl.
C01G 23/047 (2006.01)
H01L 51/00 (2006.01)
C01G 23/00 (2006.01)
C09C 1/36 (2006.01)
H01L 51/50 (2006.01)
(Continued)

(52) U.S. Cl.
CPC ......... *C01G 23/047* (2013.01); *C01G 23/003* (2013.01); *C09C 1/3653* (2013.01); *H01L 51/0032* (2013.01); *H01L 51/5076* (2013.01); *B82Y 30/00* (2013.01); *C01P 2002/54* (2013.01); *C01P 2004/64* (2013.01); *H01L 51/4226* (2013.01); *H01L 2251/303* (2013.01); *Y02E 10/549* (2013.01)

(58) Field of Classification Search
CPC . C01G 23/047; C01G 23/003; H01L 51/5076; C09C 1/3653
See application file for complete search history.

(56) References Cited

U.S. PATENT DOCUMENTS

| 5,028,568 A | 7/1991 | Anderson et al. | |
|---|---|---|---|
| 2011/0159109 A1* | 6/2011 | Lee ........................ | B82Y 30/00 424/618 |

(Continued)

OTHER PUBLICATIONS

Wang et al., "Niobium Doped $TiO_2$ with Mesoporosity and Its Application for Lithium Insertion", Chemistry of Materials, vol. 22, No. 24, Dec. 28, 2010, pp. 6624-6631.
(Continued)

*Primary Examiner* — James A Fiorito
(74) *Attorney, Agent, or Firm* — Knobbe, Martens, Olson & Bear, LLP (57) ABSTRACT

A non-aqueous composition for forming doped $TiO_2$ nanoparticles, comprising:
i. a polar solvent comprising an organic compound having one or more oxygen atoms in its chemical structure,
ii. a titanium(IV) halide, and
iii. a dopant precursor selected from transition metal halides and lanthanide halides.

23 Claims, 2 Drawing Sheets (51) Int. Cl.
    *H01L 51/42*         (2006.01)
    *B82Y 30/00*        (2011.01)

(56) References Cited

U.S. PATENT DOCUMENTS

| | | | |
|---|---|---|---|
| 2012/0199468 A1* | 8/2012 | Cheng | B01J 21/063 |
| | | | 204/157.15 |
| 2014/0248531 A1 | 9/2014 | Bing et al. | |
| 2015/0200057 A1 | 7/2015 | Feng et al. | |

OTHER PUBLICATIONS

Kim et al., "Niobium Doping Effects on $TiO_2$ Mesoscopic Electron Transport Layer-Based Perovskite Solar Cells", Chemsuschem, vol. 8, No. 14, Apr. 17, 2015, pp. 2392-2398.

Choi et al., "Efficient polymer:fullerene bulk heterojunction solar cells with n-type doped titanium oxide as an electron transport layer", Thin Solid Films 583 (2015) 86-90.

Lee et al., "Solution processed thin films of Nb-doped TiO2 nanoparticles as hole blocking layer for organic solar cells", Thin Solid Films 553 (2014) 161-165.

Kim et al., "Niobium Doping Effects on $TiO_2$ Mesoscopic Electron Transport Layer-Based Perovskite Solar Cells", Chemsuschem, DOI: 10.1002/cssc.201403478, Apr. 2015.

* cited by examiner

DOPED TITANATE

INCORPORATION BY REFERENCE TO RELATED APPLICATIONS

Any and all priority claims identified in the Application Data Sheet, or any correction thereto, are hereby incorporated by reference under 37 CFR 1.57. This application is the national phase under 35 U.S.C. § 371 of prior PCT International Application No. PCT/EP2016/081781 which has an International Filing Date of Dec. 19, 2016, which designates the United States of America, and which claims priority to European Application No. EP 15201493.2 filed Dec. 21, 2015. Each of the aforementioned applications is incorporated by reference herein in its entirety, and each is hereby expressly made a part of this specification.

TECHNICAL FIELD OF THE INVENTION

The present invention relates to electron transport layers and more specifically to doped $TiO_2$ layers useable in perovskite solar cells.

BACKGROUND OF THE INVENTION

Organometallic halide perovskites have rapidly attracted increasing interest for use as photoactive materials in photovoltaic applications. Within only a few years, the power conversion efficiency (PCE) of perovskite solar cells has undergone an unprecedented rapid rise, from the first reported PCE value of 3.8% in 2009 to the certified highest value of 20.1% in 2014 (M. A. Green et al, Prog. Photovoltaics Res. Appl. 2015, 23, 1). Depending on the location of the electron transport layer (ETL) and the hole transport layer (HTL), one of two device architectures is generally employed: either the 'normal' substrate/electrode/HTL/perovskite film/ETL/electrode or the 'inverted' substrate/electrode/ETL/perovskite film/HTL/electrode. Of these the inverted architecture has drawn the most interest in recent years. This can be explained by a higher quality of perovskite film formation on the traditional $TiO_2$ ETL layer in inverted devices, compared to the traditional PEDOT:PSS HTL layer in normal devices; leading to improved device characteristics.

Currently, the $TiO_2$ ETL layer in these devices is generally created by means of electron beam deposition, but this is a slow and costly process to use on an industrial scale. Methods for solution processing of the $TiO_2$ layer exist, but the obtained layers cannot resist the subsequent processing of the perovskite material on top of them and/or require very high temperature thermal annealing (typically 500-600° C.). Such annealing temperatures are too high for some electrodes such as indium tin oxide. This lack of resistance to subsequent processing of the perovskite material is at least partly due to the fact that both the solution processing of $TiO_2$ and of the perovskite make use of polar solvents. As a consequence, in order to prevent damages to the $TiO_2$ layer in presence of the perovskite-forming solution, the $TiO_2$ layer needs to be sufficiently thick, hard and dense; this is typically not the case for solution processed $TiO_2$ layers. The use of very high annealing temperatures for the $TiO_2$ layer is also undesired, as it limits the range of electrodes that can be used and it is incompatible with flexible substrates or Si-multi-junction devices.

As the rest of the perovskite device can be made through simple solution processing or thermal evaporation steps, the creation of the $TiO_2$ layer thus becomes a limiting step. Hence, a need exists for a solution processed ETL with high electrical conductivity, which can resist the processing of the perovskite and does not require high temperatures for its production.

SUMMARY OF THE INVENTION

It is an object of the present invention to provide good substances, devices and methods suitable for creating electron transport layers which do not require high temperatures for their production.

It is an advantage of embodiments of the present invention that the doped $TiO_2$ film obtained thereby can resist the processing, from polar solvents, of other layers on top of them.

It is an advantage of embodiments of the present invention that they permit the formation of ETLs with high electrical conductivity.

It is an advantage of embodiments of the present invention that doped $TiO_2$ films obtained thereby can be used as ETLs in both normal and inverted photovoltaic cell architectures.

The above objective is accomplished by a method and device according to the present invention.

In a first aspect, the present invention relates to a non-aqueous composition for forming doped $TiO_2$ nanoparticles, comprising:
  i. a polar solvent comprising an organic compound having one or more oxygen atoms in its chemical structure,
  ii. a titanium(IV) halide, and
  iii. a dopant precursor selected from transition metal halides and lanthanide halides.

In a second aspect, the present invention relates to a method for forming doped $TiO_2$ nanoparticles, using the composition according to any embodiment of the first aspect, by heating and stirring the composition, preferably until it becomes hazy.

In a third aspect, the present invention relates to doped $TiO_2$ nanoparticles, obtainable by the method according to any embodiment of the second aspect, wherein the method further comprises a step of precipitating said $TiO_2$ nanoparticles from the composition.

In a fourth aspect, the present invention relates to a method for forming a doped $TiO_2$ film, using the doped $TiO_2$ nanoparticles according to the third aspect, comprising:
  a. providing the nanoparticles on top of a substrate, and
  b. sintering the nanoparticles at 50 to 300° C., more preferably at 60 to 200° C., yet more preferably at 70 to 150° C. for 10 to 45 minutes.

In a fifth aspect, the present invention relates to a dispersion of doped $TiO_2$ nanoparticles, comprising the doped $TiO_2$ nanoparticles according to the third aspect, dispersed in a polar liquid medium.

A dispersion of the doped $TiO_2$ nanoparticles advantageously allows them to be provided on top of the substrate through means of solution processing. For example, the dispersion may be applied by spin coating, roll-to-roll processing or other solution processing methods.

In a sixth aspect, the present invention relates to a doped $TiO_2$ film having a thickness of at least 20 nm, obtainable by the method according to any embodiment of the fourth aspect. This film is typically pinhole-free.

In a seventh aspect, the present invention relates to a device comprising a doped $TiO_2$ film according to any embodiment of the sixth aspect, In an eighth aspect, the present invention relates to a method for forming a photovoltaic cell comprising forming a doped $TiO_2$ film according to any embodiment of the fourth aspect.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein the terms "solar cell" and "photovoltaic cell" are used interchangeably.

In a first aspect, the present invention relates to a non-aqueous composition for forming doped $TiO_2$ nanoparticles, comprising:
  i. a polar solvent comprising an organic compound having one or more oxygen atoms in its chemical structure,
  ii. a titanium(IV) halide, and iii. a dopant precursor selected from transition metal halides and lanthanide halides.

The lack of water in the composition advantageously permits slower reaction rates for the formation of doped $TiO_2$ nanoparticle and thus an increased control over the reaction, e.g. increased control over the size of the nanoparticles by adjusting the reaction time.

The polar solvent comprising a compound having one or more oxygen atoms in its chemical structure advantageously forms a source of oxygen atoms; these oxygen atoms act in the sol-gel reaction to lead to the formation of the doped $TiO_2$ nanoparticles.

The use of a dopant advantageously allows doped $TiO_2$ nanoparticles to be made, which display altered characteristics compared to pure $TiO_2$ nanoparticles, e.g. the use of a $Nb^{5+}$ dopant leads to an increased electrical conductivity.

In embodiments, the organic compound may be selected from alcohols, ethers, aldehydes, and ketones.

Alcohols, ethers, aldehydes and ketones advantageously comprise an oxygen atom which is available during the sol-gel reaction for the creation of the doped $TiO_2$.

In preferred embodiments, the main component of the polar solvent is an alcohol, an ether, an aldehyde or a ketone. For instance, the polar solvent may consist of an alcohol, an ether, an aldehyde or a ketone.

In other embodiments, the polar solvent may comprise a first component, which does not have one or more oxygen atoms in its chemical structure, and a second component, being an alcohol, an ether, an aldehyde or a ketone.

In embodiments, the polar solvent may comprise ethanol, benzyl alcohol, or a mixture thereof. Preferably, the polar solvent consists in ethanol, benzyl alcohol or a mixture thereof.

In embodiments, the dopant precursor may be selected from halides of niobium ($Nb^{5+}$), ytterbium ($Yb^{3+}$), hafnium ($Hf^{4+}$), and zirconium ($Zr^{4+}$). In embodiments, this halide may be a chloride.

The use of a $Nb^{5+}$ or $Yb^{3+}$ dopant advantageously leads to an increased electrical conductivity. It is an advantage of embodiments of the present invention that the use of a $Hf^{4+}$ or $Zr^{4+}$ dopant advantageously leads to a change in crystal structure, itself leading to a denser and harder doped $TiO_2$ layer. This permits to reduce the thickness of the doped $TiO_2$ layer.

In embodiments, the stoichiometric ratio between the dopant precursor and the titanium(IV) halide may be 5 to 30%, preferably 5 to 25%, yet more preferably 8 to 22%, yet more preferably 8 to 18%, yet more preferably 10 to 17%, yet more preferably 13 to 17% and most preferably 14-16%. An appropriate choice of the stoichiometric ratio advantageously leads to doped $TiO_2$ nanoparticles with the desired characteristics. A ratio of 15% was found to give the best power conversion efficiency in solar cells based on an Nb-doped $TiO_2$ layer according to an embodiment of the present invention.

In embodiments, the titanium(IV) halide may be titanium (IV) chloride.

In a second aspect, the present invention relates to a method for forming doped $TiO_2$ nanoparticles, using the composition according to any embodiment of the first aspect, by heating and stirring the composition. This is preferably continued until the composition becomes hazy.

Heating the solution advantageously starts and/or speeds up the sol-gel reaction which leads to the formation of doped $TiO_2$ nanoparticles. The nanoparticles scatter light, resulting in a hazy solution; the translucence of the solution may thus be used as a straightforward visual method of determining the formation of the nanoparticles. The resulting nanoparticles may, for example, have a size between 5 and 20 nm. This range of nanoparticle size is advantageous as it leads to the best performances.

In embodiments, heating and stirring the composition may be performed at 50 to 120° C., preferably at 65 to 100° C., most preferably at 75 to 85° C. For instance, heating may be performed at 80° C. The heating and stirring duration may for instance be from 6 to 48 hours. In general, a longer stirring time is preferred for higher doping levels.

The temperature and duration of the heating affect the speed of the sol-gel reaction and thus, in turn, the size of the doped $TiO_2$ nanoparticles. At a given temperature, larger or smaller nanoparticles may respectively be obtained by increasing or reducing the heating period. The speed of the reaction further depends on the doping concentration. It should also be noted that larger nanoparticles are not necessarily preferable and the optimal size of the nanoparticles may differ depending on the embodiment. The specific optimal reaction duration under a given set of conditions, and the corresponding optimal size, may however easily be determined through trial and error.

Although stirring is important, the optimal stirring speed may depend on the specific reaction conditions used. As a guideline, the stirring speed may for instance be in the range 200 rpm to 1500 rpm, 300 rpm to 1000 rpm or 400 rpm to 800 rpm. For instance, 600 rpm can be used.

In embodiments, the doped $TiO_2$ nanoparticles may be separated from the composition by precipitating them and subsequently removing them from the composition.

Separating the doped $TiO_2$ nanoparticles from the composition advantageously allows the doped $TiO_2$ nanoparticles to be obtained in a pure form.

In embodiments, the precipitation of the doped $TiO_2$ nanoparticles from the composition may be achieved by contacting the composition with a non-polar solvent. For example, diethyl ether may be added.

In embodiments, the method may further comprise after the step of precipitating the doped $TiO_2$ nanoparticles, a step where a centrifugation of the composition is performed. This is advantageous as it speeds up the separation of the $TiO_2$ nanoparticles from the composition.

In a third aspect, the present invention relates to doped $TiO_2$ nanoparticles, obtainable by the method according to the any embodiment of the second aspect, wherein the method further comprises a step of precipitating said $TiO_2$ nanoparticles from the composition.

In a fourth aspect, the present invention relates to a method for forming a doped $TiO_2$ film, using the doped $TiO_2$ nanoparticles according to the third aspect, comprising:

a. providing the nanoparticles on top of a substrate, and
  b. sintering the nanoparticles at 50 to 300° C., more preferably at 60 to 200° C., yet more preferably at 70 to 150° C. for 10 to 45 minutes. The sintering is simply obtained by way of heating. The formation of a film advantageously allows the doped $TiO_2$ nanoparticles to be used in devices, such as in solar cells or in light emitting diodes. The resulting film is advantageously pin-hole free and can be made of a thickness of at least 20 nm.

In embodiments, sintering the nanoparticles may be performed in the presence of oxygen. For example, the sintering may be performed in open air. In embodiments, providing the nanoparticles on top of the substrate may comprise:

a. dispersing the nanoparticles in a polar liquid medium, and b. applying the dispersion of the nanoparticles on top of the substrate Providing the nanoparticles on top of the substrate in the form of a dispersion of the nanoparticles advantageously allows them to be provided through means of solution processing. For example, the dispersion may be applied by spincoating, roll-to-roll processing or other solution processing methods.

In embodiments, the dispersion of the nanoparticles may additionally comprise a stabilizing agent.

A stabilizing agent may advantageously help stabilize the dispersion against undesirable precipitation of the nanoparticles.

In preferred embodiments, the stabilizing agent may be added after dispersing the nanoparticles in the polar liquid medium.

In other embodiments, dispersing the nanoparticles in the polar liquid medium may be performed in the presence of the stabilizing agent.

In embodiments, the stabilizing agent may be titanium diisopropoxide bis(acetylacetonate).

In embodiments, the polar liquid medium may comprises ethanol. For example, the polar liquid medium may consist of ethanol.

In a fifth aspect, the present invention relates to a dispersion of doped $TiO_2$ nanoparticles, comprising the doped $TiO_2$ nanoparticles according to the third aspect, dispersed in a polar liquid medium.

A dispersion of the doped $TiO_2$ nanoparticles advantageously allows them to be provided through means of solution processing. For example, the dispersion may be applied by spin coating, roll-to-roll processing or other solution processing methods.

In a sixth aspect, the present invention relates to a pinhole-free doped $TiO_2$ film having a thickness of at least 20 nm, obtainable by any embodiment of the method according to the fourth aspect.

The doped $TiO_2$ film can advantageously resist the processing of compounds, such as a perovskite, from polar solvents on top of it. In embodiments, the pinhole-free doped $TiO_2$ film may e.g. have a thickness up to 90 nm. Preferably, the thickness of the pinhole-free doped $TiO_2$ film is from 20 to 60 nm.

In a seventh aspect, the present invention relates to a device comprising a doped $TiO_2$ film according to the sixth aspect.

The pinhole-free doped $TiO_2$ film advantageously forms a good electron transport layer. The doping advantageously allows the characteristics of the $TiO_2$ film to be changed, e.g. doping with $Nb^{5+}$ improves the electrical conductivity of the film.

In embodiments, the device may be a solar cell.
In embodiments, the device may comprise:
i. an electrode on top of a substrate;
ii. a counter electrode;
iii. a doped $TiO_2$ film according to any embodiment of the sixth aspect between the electrodes;
iv. an active layer either overlaying said doped $TiO_2$ film or covered by said $TiO_2$ film,
v. optionally, one or more conduction facilitating layers between the electrodes.

In embodiments, the device may comprise:
an electrode overlaying a substrate;
one or more optional conduction facilitating layers (preferably one or more electron transporting and/or hole blocking layers) overlaying the electrode;
a doped $TiO_2$ film, according to any embodiments of the sixth aspect, overlaying the optional conduction facilitating layers if present or the electrode if no conduction facilitating layer is present;
an active layer (preferably a perovskite layer) overlaying said doped $TiO_2$ film;
one or more optional conduction facilitating layers (preferably one or more hole transporting and/or electron blocking layers) overlaying said active layer; and
a counter electrode overlaying the one or more optional conduction facilitating layers.

An active layer is a layer which performs a critical device function, the nature of which depends on the device in question. For example, an active layer may be a light harvesting layer in a solar cell, or a light emitting layer in a light emitting diode. They are typically semiconducting layers.

A conduction facilitating layer is a layer which improves the flow of electric charge carriers, as desired for the application. For example, in a solar cell, a conduction facilitating layer may be a hole or electron transporting layer, or it may be a hole or electron blocking layer. In certain embodiments, a conduction facilitating layer may combine the role of both transporting and blocking layer, e.g. a conduction facilitating layer may be a hole transporting and electron blocking layer or a conduction facilitating layer may be an electron transporting and hole blocking layer.

As used herein, the expression "one or more electron transporting and/or hole blocking layers" means one or more layers, each of them being suitable for transporting electrons and/or blocking holes.

As used herein, the expression "one or more hole transporting and/or electron blocking layers" means one or more layers, each of them being suitable for transporting holes and/or blocking electrons.

In embodiments, the device may comprise:
i. a transparent electrode on top of a transparent substrate,
ii. one or more electron transporting layers selected from an undoped $TiO_2$ layer, an organic electron transporting and/or hole blocking layer, and a combination of both an undoped $TiO_2$ layer and an organic electron transporting and/or hole blocking layer, overlying the transparent electrode,
iii. a doped $TiO_2$ layer according to any embodiment of the sixth aspect, overlying the one or more electron transporting layers,
iv. a perovskite layer (active layer) overlying the doped $TiO_2$ layer,
v. optionally, a hole transporting and/or electron blocking layer,
vi. a counter electrode.

Advantageously, such a device allows to take advantage of the benefits of the doped $TiO_2$ layer for use in e.g. a solar cell.

In an eighth aspect, the present invention relates to a method for forming an optoelectronic device such as a photovoltaic cell comprising the steps of:
overlaying a substrate with an electrode;
overlaying the electrode with one or more optional conduction facilitating layers (preferably one or more electron transporting and/or hole blocking layers);
overlaying the one or more optional conduction facilitating layers if present or the electrode if no conduction facilitating layer is present with nanoparticles according to any embodiment of the third aspect;

sintering the nanoparticles according to any embodiment of the fourth aspect, thereby forming a doped TiO$_2$ film;

overlaying said doped TiO$_2$ film with an active layer (preferably a perovskite layer);

overlying the active layer with one or more optional conduction facilitating layers (preferably one or more hole transporting and/or electron blocking layers); and overlaying the one or more optional conduction facilitating layers with a counter electrode.

The invention will now be described by a detailed description of several embodiments of the invention. It is clear that other embodiments of the invention can be configured according to the knowledge of the person skilled in the art without departing from the true spirit or technical teaching of the invention, the invention being limited only by the terms of the appended claims.

Unless provided otherwise, all solvents used are dry and only opened inside the glove box filled with dry N$_2$.

EXAMPLE 1

Making Nb-Doped TiO$_2$ Nanoparticles

TiO$_2$ nanoparticles with different Nb doping levels were prepared. As a reference, also non-doped TiO$_2$ nanoparticles were prepared.

In a glove box filled with nitrogen, 0.1 ml TiCl$_4$ (Sigma Aldrich) was added to 0.4 ml of ethanol comprising different amounts of NbCl$_5$ (Sigma Aldrich). For preparing the non-doped TiO$_2$ nanoparticles pure ethanol was used. For preparing the Nb-doped TiO$_2$ nanoparticles with different Nb doping levels, different amounts of NbCl$_5$ (Sigma Aldrich) were first dissolved per 1 ml ethanol: 30.8 mg, 61.6 mg, 92.4 mg and 123.2 mg of NbCl$_5$ respectively; this yielded colorless solutions. Then, 0.1 ml TiCl$_4$ was added to 0.4 ml of the respective solutions. The amounts of NbCl$_5$ correspond respectively to a 5%, 10%, 15% and 20% stoichiometric ratio compared to TiCl$_4$. During mixing, smoke and heat was produced. After mixing, a yellow clear solution was obtained. 2 ml benzyl alcohol was added to this yellow solution leading to a light yellow and clear solution. This solution was stirred on a stirring hotplate at 600 rpm and heated at 80° C. inside the glove box for different durations: 7 hours for the non-doped TiO$_2$ nanoparticles; 8 hours for 5% Nb-doped nanoparticles; 9 hours for the 10% doped nanoparticles; and 10 hours for the 15% and 20% doped nanoparticles. After this stage, a colorless, slightly hazy solution was obtained. The haziness of the solution is caused by the created white TiO$_2$ nanoparticles.

EXAMPLE 2

Making a Dispersion of the Nb-Doped TiO$_2$ Nanoparticles

Example 1 was repeated. 1 ml of the resulting solution was precipitated in 12 mL of diethyl ether (Sigma Aldrich) and centrifuged at 5000 rpm for two minutes, in order to isolate the nanoparticles from the solvent and any unreacted reagents. After centrifugation, the solvent was drained out and the obtained solid white nanoparticles were dispersed in 3 ml ethanol leading to a milky (white and hazy) solution. In order to stabilize this dispersion, 45 μl titanium diisopropoxide bis(acetylacetonate) (Sigma Aldrich) was added to the solution (15 μl per 1 ml solvent). The mixture was placed on a stirring plate at 600 rpm at room temperature. After less than one hour of stirring, a light green and clear dispersion was obtained. This dispersion was stable and after removing it from the stirring plate no aggregation of particles occurred.

EXAMPLE 3

Figure 1:
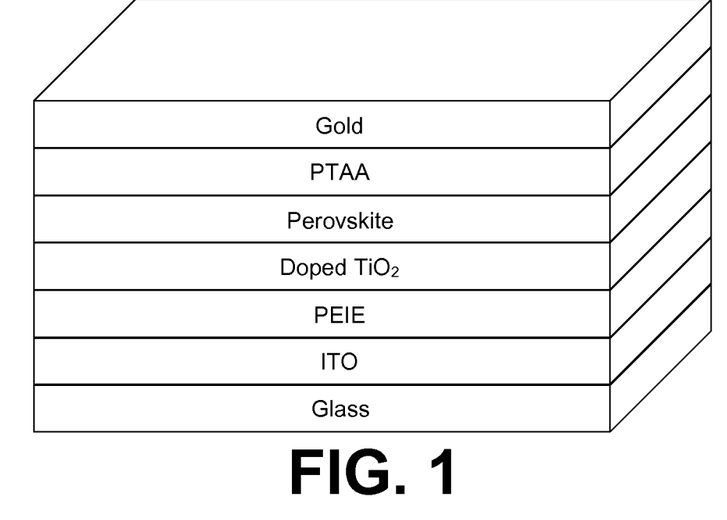
FIG. 1 is a sequence of stacked layers for forming a solar cell according to an embodiment of the present invention.
Figure 2:
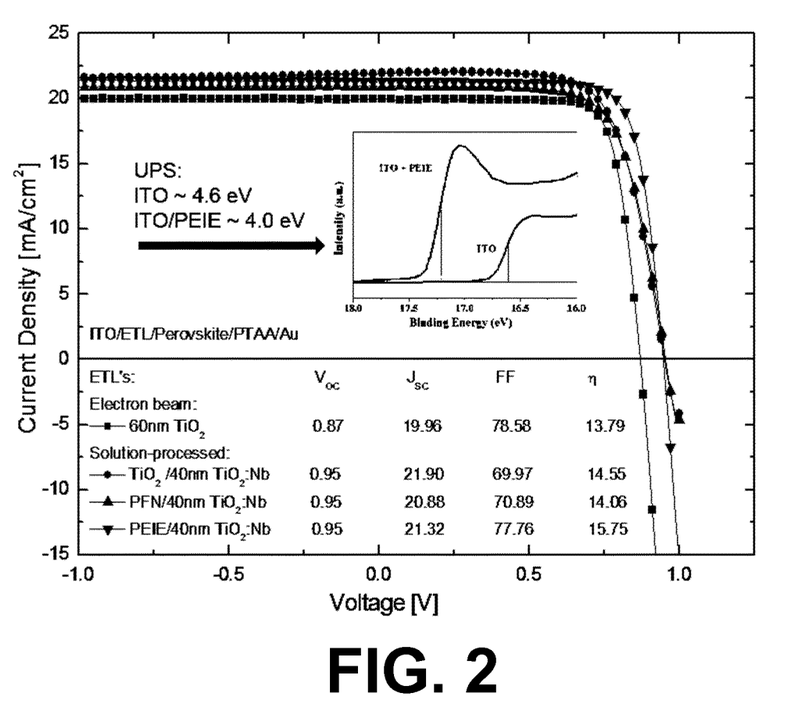
FIGS. 2 and 3 show solar cell device characteristics for cells comprising layers obtained according to embodiments of the present invention and for layers obtained according to the prior art.

Making Solar Cells Based on Layers Made from the Doped TiO$_2$ Nanoparticles with 15% Stoichiometric Dopant Ratio We now refer to FIG. 1 (device structure) and FIG. 2 (device characteristics). Example 2 was repeated. A glass/ITO substrate was coated by a 3 nm thick commercially available ethoxylated polyethylenimine (PEIE) or by a 1 nm thick poly [(9,9-bis(3'-(N,N-dimethylamino)propyl)-2,7-fluoreneyalt-2,7-(9,9-dioctylfluorene)] (PFN), or by a 3 nm thick pure (non-doped) and amorphous TiO$_2$ layer; this additional interposed layer was used in order to improve the energy level alignment between the ITO layer and the doped TiO$_2$ layer. After having provided the additional layer (PEIE, PFN or non-doped TiO$_2$), a dispersion with 15% stoichiometric dopant ratio from example 2 was spin coated onto the substrate in air at 3000 rpm for 60 sec, resulting in a 40 nm thick film. This film was then heated at 100° C. for 30 minutes in air to create the Nb-doped TiO$_2$ electron transport layer. After having formed the Nb-doped TiO$_2$ electron transport layer, the substrates were inserted into a glove box filled with nitrogen. Then, to create a perovskite layer of about 300 nm thickness, a solution of methyl ammonium lead iodide dissolved into Dimethylformamide (DMF) was spin coated at 4000 rpm for 60 seconds onto the substrates and heated at 100° C. for 2 hours. Next a 60 nm thick layer of PTAA as a hole transport layer was spin coated, from a chlorobenzene solution, onto the perovskite films. The cells were capped off with evaporation of 100 nm of gold (Au) as a top electrode. In addition, a reference device was fabricated in which electron beam deposition was used for creating a 60 nm thick non-doped TiO$_2$ layer.

EXAMPLE 4

Figure 3:
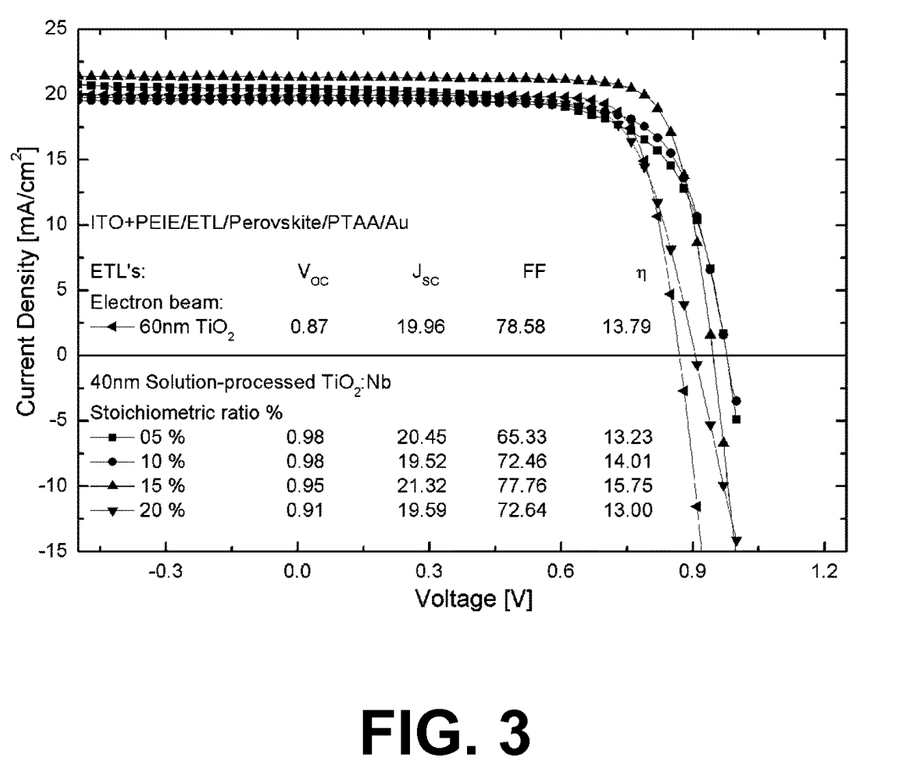

Making Solar Cells Based on Layers Made from the Doped TiO$_2$ Nanoparticles with Different Dopant Ratios We now refer to FIG. 1 (device structure) and FIG. 3 (device characteristics). Example 3 was repeated, but different stoichiometric dopant ratios ranging from 5 to 20% were used. PEIE was used as the interposed layer.

EXAMPLE 5

Comparing Solar Cells

We now refer to FIG. 2, showing current-voltage characteristics of solar cells from example 3. Solar cells comprising a Nb-doped TiO$_2$ electron transport layer (ETL) with a 15% stoichiometric doping ratio and comprising different additional interposed layers between the ITO layer and the ETL layer are compared. The results are further compared with a reference cell comprising a 60 nm thick TiO$_2$ ETL, produced by electron beam deposition. From the results it can be concluded that the solar cells having a Nb-doped TiO$_2$ ETL layer in accordance with embodiments of the present invention have a higher power conversion efficiency ($\eta$, PCE) than the reference cell. They have a higher open-circuit voltage ($V_{oc}$) and a higher short-circuit density ($J_{sc}$) but a lower fill factor (FF). The highest power conversion efficiency (15.75%) is obtained for a cell with a PEIE interposed layer. Furthermore, the inset of FIG. 2 displays the shift in energy levels between ITO and ITO/PEIE as obtained by ultraviolet photoelectron spectroscopy (UPS).

We now refer to FIG. 3, showing current-voltage characteristics of solar cells from example 4. Solar cells comprising a PEIE interposed layer and comprising a Nb-doped $TiO_2$ electron transport layer (ETL) with different stoichiometric doping ratios (5%, 10%, 15% and 20%) are compared. The results are further compared with a reference cell comprising a 60 nm thick $TiO_2$ ETL, produced by electron beam deposition. From the results it can be concluded that the solar cells having a Nb doped $TiO_2$ ETL layer in accordance with embodiments of the present invention have a higher power conversion efficiency (PCE) than the reference cell for the 10% and 15% doping ratios, and a lower power conversion efficiency for the 5% and 20% doping ratios. The highest PCE is obtained for the 15% doping ratio in combination with the interposed layer.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A method for forming doped $TiO_2$ nanoparticles, comprising:
   heating and stirring a non-aqueous composition whereby doped $TiO_2$ nanoparticles are obtained, the non-aqueous composition comprising:
   a polar solvent comprising an organic compound having one or more oxygen atoms in its chemical structure,
   a titanium(IV) halide, and
   a dopant precursor selected from the group consisting of transition metal halides and lanthanide halides, and wherein a stoichiometric ratio between the dopant precursor and the titanium(IV) halide is from 10-17%.

2. The method of claim 1, wherein the organic compound is selected from the group consisting of alcohols, ethers, aldehydes, and ketones.

3. The method of claim 1, wherein the polar solvent comprises an alcohol selected from the group consisting of ethanol, benzyl alcohol, and a mixture thereof.

4. The method of claim 1, wherein the dopant precursor is selected from the group consisting of halides of niobium, halides of ytterbium, halides of hafnium, and halides of zirconium.

5. The method of claim 1, wherein the dopant precursor is selected from the group consisting of transition metal chlorides and lanthanide chlorides.

6. The method of claim 1, wherein the titanium(IV) halide is titanium(IV) chloride.

7. The method of claim 1, wherein the heating and the stirring heating and the stirring the non-aqueous composition is performed until the non- aqueous composition becomes hazy.

8. The method of claim 1, where the heating of the composition is performed at 50 to 120° C. for a period of 6 to 48 hours.

9. The method of claim 8, where the heating of the composition is performed at 65 to 100° C.

10. The method of claim 9, where the heating of the composition is performed at 75 to 85° C.

11. The method of claim 1, further comprising:
    precipitating the doped $TiO_2$ nanoparticles from the non-aqueous composition.

12. The method of claim 2, wherein the polar solvent further comprises a component that does not have one or more oxygen atoms in its chemical structure.

13. The method of claim 1, wherein the stoichiometric ratio between the dopant precursor and the titanium(IV) halide is from 14-16%.

14. The method of claim 1, wherein a size of the doped $TiO_2$ nanoparticles is controlled to between 5 nm and 20 nm.

15. The method of claim 1, further comprising separating the doped $TiO_2$ nanoparticles from the non-aqueous composition to obtain the doped $TiO_2$ nanoparticles in a pure form.

16. The method of claim 1, further comprising contacting the non-aqueous composition with a nonpolar solvent to obtain precipitation of the doped $TiO_2$ nanoparticles.

17. The method of claim 16, further comprising centrifuging the non-aqueous composition so as to separate out the doped $TiO_2$ nanoparticles.

18. The method of claim 1, wherein the dopant is $Nb^{5+}$, whereby an electrical conductivity of the doped $TiO_2$ nanoparticles is increased when compared to an electrical conductivity of undoped $TiO_2$ nanoparticles.

19. The method of claim 1, wherein the dopant is $Yb^{3+}$, whereby an electrical conductivity of the doped $TiO_2$ nanoparticles is increased when compared to an electrical conductivity of undoped $TiO_2$ nanoparticles.

20. The method of claim 1, wherein the dopant is $Hf^{4+}$, whereby a density of the doped $TiO_2$ nanoparticles is increased when compared to a density of undoped $TiO_2$ nanoparticles.

21. The method of claim 1, wherein the dopant is $Zr^{4+}$, whereby a density of the doped $TiO_2$ nanoparticles is increased when compared to a density of undoped $TiO_2$ nanoparticles.

22. The method of claim 1, wherein the doped $TiO_2$ nanoparticles are adapted for use in a layer in a solar cell, the layer adapted to resist a subsequent processing of a perovskite material on top of the layer.

23. The method of claim 1, wherein the doped $TiO_2$ nanoparticles are adapted for use in a layer in a solar cell adapted, the layer adapted to not require very high temperature thermal annealing of 500-600° C.

* * * * *

UNITED STATES PATENT AND TRADEMARK OFFICE
CERTIFICATE OF CORRECTION

PATENT NO. : 10,703,642 B2
APPLICATION NO. : 16/061307
DATED : July 7, 2020
INVENTOR(S) : Afshin Hadipour It is certified that error appears in the above-identified patent and that said Letters Patent is hereby corrected as shown below:

In the Specification

Column 10, Line 16 (approx.), delete "fluoreneyalt-2,7-" and insert --fluorene)-alt-2,7- --.

In the Claims

Column 12, Line 5, Claim 7, delete "non- aqueous" and insert --non-aqueous--.

Signed and Sealed this
Twenty-second Day of September, 2020

Andrei Iancu
*Director of the United States Patent and Trademark Office*